United States Patent [19]

Miyamoto

[11] 4,177,633

[45] Dec. 11, 1979

[54] TIME CORRECTING MEANS FOR A DIGITAL ELECTRONIC WATCH

[75] Inventor: Masao Miyamoto, Tokyo, Japan

[73] Assignee: Kabushiki Kaisha Daini Seikosha, Japan

[21] Appl. No.: 921,234

[22] Filed: Jul. 3, 1978

[30] Foreign Application Priority Data

Jul. 20, 1977 [JP] Japan ................................ 52-87108

[51] Int. Cl.[2] ........................ G04C 3/00; G04B 27/00; H01L 29/84

[52] U.S. Cl. .................................... 58/23 R; 58/85.5; 357/26

[58] Field of Search ................ 58/23 R, 23 BA, 50 R, 58/85.5; 357/26

[56] References Cited

U.S. PATENT DOCUMENTS

| | | | |
|---|---|---|---|
| 3,808,473 | 4/1974 | Yamashita et al. | 357/26 |
| 4,090,353 | 5/1978 | Maeda et al. | 58/85.5 |
| 4,095,405 | 6/1978 | Tanaka | 58/4 A |
| 4,107,915 | 8/1978 | Sekiya et al. | 58/23 R |

*Primary Examiner*—Vit W. Miska
*Attorney, Agent, or Firm*—Robert E. Burns; Emmanuel J. Lobato; Bruce L. Adams

[57] ABSTRACT

Time correcting means for a digital electronic watch enables time correction to be carried out by manually applying pressure to a pressure sensitive diode. By changing the magnitude of the applied pressure, the time correcting speed can accordingly be changed in two or three steps.

6 Claims, 3 Drawing Figures

TIME CORRECTING MEANS FOR A DIGITAL ELECTRONIC WATCH

BACKGROUND OF THE INVENTION

This invention relates to a time correcting means for a digital electronic watch wherein the time correcting speed can be changed in response to the pressure applied to a distortion semiconductor.

Digital electronic watches have become increasingly more popular due to developments made in display devices using liquid crystal or light emitting diodes. Though time display of this kind of a digital electronic watch is easy to ascertain, the operation for performing a time correction is rather complicated and takes a lot of time.

By way of example, the "hour indication" is corrected normally as follows. First of all, the operation button is set to the position for making the hour correction and then hour correction is carried out by means of a train of pulses generated every half second when the button is operated to correct the hour indication. Correction of the "minute indication" and "second indication" is carried out by almost the same operation as that of the "hour indication". Needless to say the operation button cooperates with a functional switch such as hour, minute or second correction switch and the indicated time is corrected one increment by each one action of the button.

SUMMARY OF THE INVENTION

One object of this invention is to provide a time correcting means for a digital electronic watch, by which the correcting operation can be carried out easily and speedily.

Another object of this invention is to provide a time correcting means for a digital electronic watch in which the correcting operation is carried out by manually applying pressure to a distortion semiconductor, such as a pressure sensitive diode.

Further object of this invention is to provide a time correcting means for a digital electronic watch in which the indicated time is corrected at different speeds in response to the magnitude of the pressure applied to the distortion semiconductor.

Still further object of the invention is to provide a time correcting means for a digital electronic watch consisting of a switching means, voltage level detecting means, a selective circuit and a chattering preventing circuit.

The foregoing and other objects as well as the characteristic features of the invention will become more apparent and more readily understandable by the following description and the appended claims when read in conjunction with the accompanying drawings.

DETAILED DESCRIPTION OF THE INVENTION

Figure 1:
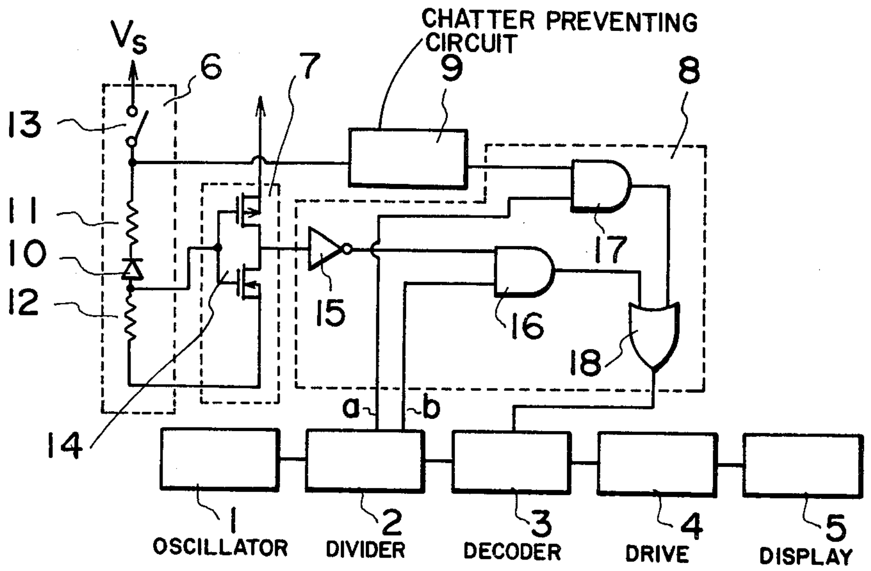
FIG. 1 shows one embodiment of the time correcting means according to the invention.

Referring to drawings, two embodiments of this invention will now be explained. A typical digital electronic watch consists of an oscillator circuit 1, a divider circuit 2, a decoder circuit 3, a driving circuit 4 and a display device 5 as shown in block form in FIG. 1. Time correcting means according to this invention consists of a switching means 6 having a distortion semiconductor, such as a pressure sensitive diode 10, whose value of resistance changes in response to the pressure applied thereto, a voltage level detecting means 7 for detecting the voltage drop across a resistor 12, a selective circuit 8 for selectively transferring the correcting pulse trains of different frequencies to the decoder circuit 3 in response to the pressure applied to the pressure sensitive diode 10, and a chattering preventing circuit 9, and the time correcting means is connected to a typical digital electronic watch as shown in the drawings.

Referring to FIG. 1, when an operation switch 13 is in the open state and time correction is not carried out, the voltage level between both terminals of the resistor 12 is zero ($V_{12}=0$). In this case, since the output of the voltage level detecting circuit 14 consisting of C MOS transistors is at a high level, one input of an AND gate 16 is maintained at a low level because of the existense of an inverter circuit 15, and therefore the correcting pulse train "b" from the divider circuit 2 is not able to pass through the AND gate 16 to the decoder circuit 3. And since no signal passes through the chattering preventing circuit 9, one input of an AND gate 17 is maintained at a low level, and thus the correcting pulse train "a" from the divider circuit 2 is not able to pass through the AND gate 17 to the decoder circuit 3.

When the switch 13 is switched to the closed state to place the watch in its time correcting mode for carrying out time correction, one signal passes through the chattering preventing circuit 9 and is fed to the AND gate 17 in the selective circuit 8. The other signal is fed to the pressure sensitive diode 10. The reverse equivalent resistance 11 of the diode 10 is defined as follows: when the reverse voltage is applied to the pressure sensitive diode, the reverse current flows in response to the pressure applied to said diode and the applied reverse voltage thereto. In other words, the reverse current is a function of said pressure and said reverse voltage. Since the reverse equivalent resistance 11 of said pressure sensitive diode 10 and the resistor 12 are connected in series, the voltage drop generated between both ends of the resistor 12 which varies in response to the pressure applied to said pressure sensitive diode 10 is applied to the voltage level detecting means 7. In case the applied voltage is above the threshold voltage of the voltage level detecting circuit 14, the signal is supplied to AND gate 16 via the inverter 15 of the selective circuit 8. The selective circuit 8 selectively transfers the correcting pulse train "a" of higher frequency or the pulse train "b" of lower frequency to the decoder circuit 3 in response to the pressure applied to the pressure sensitive diode 10.

Since the divider circuit 2 consists of flip-flop circuits, there is no phase difference between the pulse trains "a" and "b". Accordingly, if AND gate circuits 16 and 17 activate at the same time, time correcting pulse train "b" having higher frequency is supplied to the decoder circuit 3 via an OR gate 18. However, if the phase of pulse trains "a" and "b" is different, the signal supplied to a decoder circuit 3 is determined by the sum of each pulse train. In case the time correcting signal faster than the fast pulse train "a" is needed, such a signal can easily be obtained by connecting a delay circuit or an inverter circuit which delays the phase of pulse train "a" or "b" in the degree of $\pi$.

Modification can easily be made, for example, a one-shot multi-vibrator can be substituted for the chattering preventing circuit 9, and the AND gate 17 and pulse train "a" removed. The output signal of said one-shot multi-vibrator would be directly supplied to the OR gate 18. Then, in case the pressure sensitive diode 10 is lightly or weakly pushed, the indicated time is corrected one step. On the other hand if, said diode 10 is strongly pushed, the indicated time is continuously corrected.

Now reference will be made to a basic operating principle of this invention. Suppose that the switch 13 is in the ON state, the reverse equivalent resistance of the pressure sensitive diode 10 is r(p), the resistance of resistor 12 is $R_{12}$ and the voltage of the power source is $V_s$, then the generated voltage $V_{12}$ between both terminals of the resistor 12 is given as follows.

$$V_{12} = \frac{V_s \cdot R_{12}}{R_{12} + r(p)}$$

Figure 3:
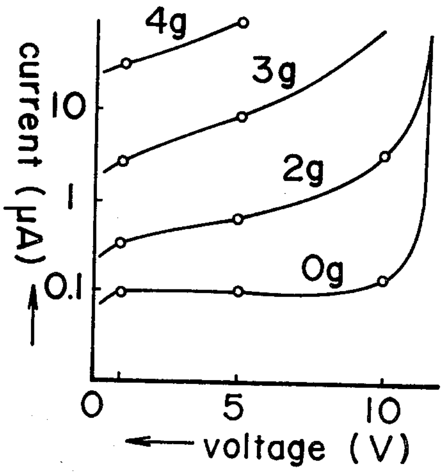
FIG. 3 shows the reverse characteristic of a pressure sensitive diode relating to current-voltage at different levels of pressure applied thereto.

When a relatively strong pressure is not being applied to the pressure sensitive diode 10, the value of said voltage $V_{12}$ is lower than the threshold voltage of the voltage level detecting circuit 14. Since the output of said voltage level detecting circuit 14 is at a high level, no signal is fed to the AND gate 16 because of the existence of the inverter 15. In this case, since only AND gate 17 is open, time display is corrected by the pulse train "a" whose period is relatively slow. Suppose that the power source voltage $V_s$ is 1.57 volt, the pressure sensitive diode 10 has the characteristic shown in FIG. 3, the threshold voltage of the voltage level detecting circuit 14 is 0.7 volt and the resistance value of the resistor 12 is about the range of 1-10 MΩ, the output of the voltage level detecting circuit 14 consisting of C MOS circuitry does not change to the low level when a pressure in the range of about 0.5 g-1.8 g is applied to the diode 10.

When a pressure more than 2.0 g is applied to the diode 10, since the voltage drop ($V_{12}$) across the resistor 12 is more than 0.7 volt, the output of the voltage level detecting circuit 14 changes to the low level. As a result, the AND gate circuit 16 becomes open because of the existence of the inverter 15. As mentioned above, since the fast pulse train "b" and the slow pulse train "a" are supplied to the OR gate circuit 18 in phase, and the fast pulse train "b" is supplied to the decoder circuit 3, the indicated time is corrected in a quick manner.

It is preferable that the period of the slow pulse train "a" be about 0.5-1 sec and the period of the fast or quick pulse train "b" be about $\frac{1}{8}$-1/16 second. Needless to say, the voltage drop $V_{12}$ across the resistor 12 varies in a fairly large amount because the value of the reverse equivalent resistance 11 of the pressure sensitive diode 10 which is connected in series with the resistor 12 changes proportionately to the pressure applied thereto. The quick time correcting speed can be changeable in proportion to the pressure applied to the diode 10 by using a plurality of voltage level detecting circuits whose threshold voltage are different.

Figure 2:
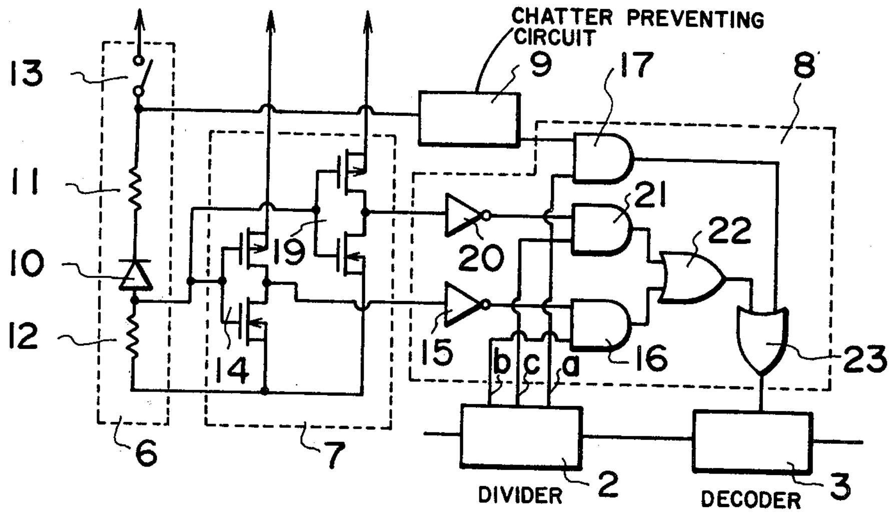
FIG. 2 shows another embodiment of the time correcting means according to the invention, wherein the time correcting speed is changeable in three steps.

FIG. 2 shows another embodiment of this invention having two voltage level detecting circuits 14 and 19. Since the operation of this circuit is generally the same as the circuit having only one voltage level detecting circuit, the following discussion pertains to the differences in operation due to use of two voltage level detecting circuits. As in the former embodiment, the power source voltage $V_s$ is 1.57 volt, the pressure sensitive diode 10 has the characteristic shown in FIG. 3 and the threshold voltages of the voltage level detecting circuits 14 and 19 consisting of C MOS circuitry are respectively 0.7 volt and 0.8 volt. In this case, the resistance value $R_{12}$ of the resistor 12 is selected about 5 MΩ.

After the switch 13 is closed (the ON state), pressure is applied on the pressure sensitive diode 10. When the pressure reaches about 1.2-1.3 g, the output of the voltage level detecting circuit 14 comes to the low level because the voltage drop $V_{12}$ across the resistor 12 exceeds over 0.7 volt which is the threshold voltage of the voltage level detecting circuit 14. However, since the voltage drop across resistor 12 is less than 0.8 volt at this stage, the output of the voltage level detecting circuit 14 does not assume low level. And since AND gate circuits 16 and 17 open at this stage, the indicated time is corrected by the slow pulse train "a" and the quick pulse train "b".

When the pressure applied on the diode 10 exceeds more than about 1.5 g, the output of both voltage level detecting circuits 14 and 19 assume the low level because the voltage drop $V_{12}$ across the resistor exceeds the threshold voltage of said both voltage level detecting circuits 14 and 19. As a result, since three AND gate circuits 16, 17 and 21 open, the indicated time is quickly corrected by the quicker pulse train "c".

According to this invention, the speed of time correction can be varied in two or three steps in proportion to the pressure applied to the diode 10 by using two voltage level detecting circuits whose threshold voltages are different, however, the speed of time correction can be varied in multi-steps by using a plurality of voltage level detecting circuits, inverter circuits, AND gate circuits and OR gate circuits. In case a plurality of voltage level detecting circuits are used, it is preferable that the chattering preventing circuit should consist of a one-shot multivibrator and AND gate circuit 17 should be omitted.

In the described embodiments of this invention, the reverse characteristic of a pressure sensitive diode is used, however, the forward characteristic can also be used. In case of using the forward characteristic, if the power source voltage is 1.57 volt, the degree of current passing through a pressure sensitive diode is on the order of milli-amperes when no pressure is applied to said diode. For the reason mentioned above, it is preferable to use the reverse characteristic of said diode for saving power consumption, particularly in case the object is a digital watch using a liquid crystal display device.

According to the present invention, time correction can easily and quickly be carried out by applying the pressure on a pressure sensitive diode. Moreover, since the correcting speed can be changed by changing the amount of pressure applied to the diode, excellent time correcting means may be available from the point of human engineering.

While preferred embodiments of the invention has been shown and described it will be understood that many modifications and changes can be made within the true spirit and scope of the invention.

I claim:

1. Time correcting means for a digital electronic watch of the type having a decoder circuit for effecting time correction in response to correcting pulse trains applied thereto when the watch is placed in its time correcting mode, said time correcting means comprising:

switching means including a distortion semiconductor having a resistive characteristic which varies in response to pressure applied thereto; a resistor connected in series with said distortion semiconductor; voltage level detecting means to detect the voltage level across said resistor; and a signal selective circuit coacting with said voltage level detecting means to selectively transfer correcting pulse trains of different frequencies to said decoder circuit for changing the time correcting speed in response to pressure applied to said distortion semiconductor.

2. Time correcting means for a digital electronic watch according to claim 1, wherein said distortion semiconductor comprises a pressure sensitive diode connected in the reverse direction thereby taking advantage of its reverse characteristics.

3. Time correcting means for a digital electronic watch according to claim 1, wherein said voltage level detecting means comprises a plurality of voltage level detecting elements whose threshold voltages are different.

4. Time correcting means for a digital electronic watch of the type having a decoder circuit for effecting time correction in response to correcting pulse trains applied thereto when the watch is placed in its time correcting mode, said time correcting means comprising: switching means comprising an operation switch for switching the watch to its time correcting mode, a reverse-connected pressure sensitive diode having a resistive characteristic which varies in response to pressure applied thereto, and a resistor connected to said diode; voltage level detecting means to detect the voltage level across said resistor; and a signal selective circuit coacting with said voltage level detecting means to selectively transfer correcting pulse trains of different frequencies to said decoder circuit for changing the time correcting speed in response to pressure applied to said diode.

5. Time correcting means for a digital electronic watch according to claim 1, wherein said voltage level detecting means includes means for detecting the voltage level across said resistor and providing a corresponding output signal when the detected voltage level exceeds a certain value corresponding to a certain magnitude of pressure being applied to said distortion semiconductor; and wherein said signal selective circuit includes means for applying a correcting pulse train of one frequency to said decoder circuit in the absence of said output signal and being responsive to said output signal for selectively applying another correcting pulse train of a different frequency to said decoder circuit.

6. Time correcting means for a digital electronic watch according to claim 4, wherein said voltage level detecting means includes means for detecting the voltage level across said resistor and providing a corresponding output signal when the detected voltage level exceeds a certain value corresponding to a certain magnitude of pressure being applied to said pressure sensitive diode; and wherein said signal selective circuit includes means for applying a correcting pulse train of one frequency to said decoder circuit in the absence of said output signal and being responsive to said output signal for selectively applying another correcting pulse train of a different frequency to said decoder circuit.

* * * * *